US010859920B2

(12) United States Patent
Liao et al.

(10) Patent No.: US 10,859,920 B2
(45) Date of Patent: Dec. 8, 2020

(54) MASK AND FABRICATION METHOD THEREOF, DISPLAY PANEL AND TOUCH PANEL

(71) Applicants: BOE TECHNOLOGY GROUP CO., LTD., Beijing (CN); HEFEI BOE OPTOELECTRONICS TECHNOLOGY CO., LTD., Hefei (CN)

(72) Inventors: Liqing Liao, Beijing (CN); Hongmin Li, Beijing (CN); Jian Tao, Beijing (CN)

(73) Assignees: BOE TECHNOLOGY GROUP CO., LTD., Beijing (CN); HEFEI BOE OPTOELECTRONICS TECHNOLOGY CO., LTD., Hefei (CN)

( * ) Notice: Subject to any disclaimer, the term of this patent is extended or adjusted under 35 U.S.C. 154(b) by 26 days.

(21) Appl. No.: 16/059,481

(22) Filed: Aug. 9, 2018

(65) Prior Publication Data

US 2019/0113851 A1 Apr. 18, 2019

(30) Foreign Application Priority Data

Oct. 16, 2017 (CN) .......................... 2017 1 0975409

(51) Int. Cl.
*G03C 5/00* (2006.01)
*G03F 7/20* (2006.01)
(Continued)

(52) U.S. Cl.
CPC ............ *G03F 7/70358* (2013.01); *G03F 1/76* (2013.01); *G03F 1/78* (2013.01); *G03F 7/0005* (2013.01);
(Continued)

(58) Field of Classification Search
CPC . H01L 21/32139; H01L 21/31; H01L 21/308; H01L 21/31144; G03F 7/70358; G03F 1/76; G03F 1/78; G03F 7/0005; G03F 7/70475; G03F 7/70791; G03F 7/70275; G03F 7/70383; G03F 7/70466;
(Continued)

(56) References Cited

U.S. PATENT DOCUMENTS 10,274,760 B2 * 4/2019 Lee ....................... G02F 1/1303
2008/0241486 A1 * 10/2008 Ishikawa ............. G03F 7/70275
428/195.1

(Continued)

*Primary Examiner* — Shouxiang Hu

(57) ABSTRACT

A fabrication method of a mask and a mask, a display panel and a touch panel are provided. The fabrication method of the mask includes: providing a substrate; forming a photoresist material layer on the substrate; and performing at least two scanning exposure processes on the photoresist material layer by using a scanning beam, wherein, each of the at least two scanning exposure processes is performed along a first direction parallel to a surface where the substrate is located, the scanning beam in each of the at least two scanning exposure processes scans the photoresist material layer in a scanning region having a preset width, at least one pair of adjacent scanning regions partially overlap with each other, and a partially overlapping region of the at least one pair of adjacent scanning regions is located in a first region of the mask.

8 Claims, 6 Drawing Sheets

(51) Int. Cl.
G06F 3/044 (2006.01)
G03F 7/00 (2006.01)
G03F 1/76 (2012.01)
G03F 1/78 (2012.01)
G06F 3/041 (2006.01)
H01L 21/31 (2006.01)
G03F 7/22 (2006.01)
H01L 21/308 (2006.01)
H01L 21/311 (2006.01)

(52) U.S. Cl.
CPC ............ *G03F 7/22* (2013.01); *G03F 7/70275* (2013.01); *G03F 7/70383* (2013.01); *G03F 7/70466* (2013.01); *G03F 7/70475* (2013.01); *G03F 7/70791* (2013.01); *G06F 3/041* (2013.01); *G06F 3/044* (2013.01); *H01L 21/308* (2013.01); *H01L 21/31* (2013.01); *H01L 21/31144* (2013.01); *G06F 2203/04103* (2013.01)

(58) Field of Classification Search
CPC . G03F 7/22; G06F 3/041; G06F 3/044; G06F 2203/04103
See application file for complete search history.

(56) References Cited

U.S. PATENT DOCUMENTS

| | | | |
|---|---|---|---|
| 2009/0073505 A1* | 3/2009 | Sumi | B41J 2/465 358/474 |
| 2009/0098479 A1* | 4/2009 | Sykes | G03F 7/70041 430/270.1 |
| 2014/0053399 A1* | 2/2014 | Askebjer | H05K 3/0017 29/846 |

* cited by examiner

MASK AND FABRICATION METHOD THEREOF, DISPLAY PANEL AND TOUCH PANEL

TECHNICAL FIELD

At least one embodiment of the present disclosure relates to a mask and a fabrication method thereof, a display panel and a touch panel.

BACKGROUND

In a current production process of high-precision electronic display products, multiple exposure processes are required. A mask needs to be used in the exposure process, and a pattern of a corresponding shape is formed in a product by means of a pattern on the mask.

However, as limited by a current mask fabrication process, during a procedure for preparing a mask pattern, a portion of the pattern will be repeatedly exposed, and the portion of the pattern repeatedly exposed will have its critical dimension (CD) deviated; when a mask having a CD deviation is used for preparing an electronic product, for example, a display panel, the entire electronic product may incur a functional defect, for example, the display panel will incur a display defect.

SUMMARY

At least one embodiment of the present disclosure provides a fabrication method of a mask, which includes: providing a substrate; forming a photoresist material layer on the substrate; and performing at least two scanning exposure processes on the photoresist material layer by using a scanning beam, wherein, each of the at least two scanning exposure processes is performed along a first direction parallel to a surface where the substrate is located, the scanning beam in each of the at least two scanning exposure processes scans the photoresist material layer in a scanning region having a preset width, at least one pair of adjacent scanning regions partially overlap with each other, and a partially overlapping region of the at least one pair of adjacent scanning regions is located in a first region of the mask.

For example, in the fabrication method of the mask according to at least one embodiment of the present disclosure, during a procedure for forming a structural layer of a device to be formed with the mask, a projection of the first region on a surface where the device is located coincides with a non-effective region of the device, and the preset width is a width of the scanning beam in a second direction perpendicular to the first direction.

For example, in the fabrication method of the mask according to at least one embodiment of the present disclosure, the device includes an effective region, and when the mask is used for forming the device, a miniature ratio of the mask is X:1, and in the second direction, the effective region has a width of $W1$, the non-effective region has a width of $W2$, the non-effective regions with a preset width of $L$ are provided at both sides of each of the effective regions, and the preset width $L$ satisfies: $X*(W1+W2) \leq L \leq X*(N*(W1+W2)+2*W2)$, where, $N$ is a positive integer, and $X>0$.

For example, in the fabrication method of the mask according to at least one embodiment of the present disclosure, a width of the partially overlapping region is $L1$, the width of the partially overlapping region satisfies: $0 \leq L1 \leq 2X*W2$, and the width of the partially overlapping region is a width in the second direction.

For example, in the fabrication method of the mask according to at least one embodiment of the present disclosure, before forming the photoresist material layer on the substrate, further comprising: forming a light-shielding material layer on the substrate; the fabrication method further comprises: developing the photoresist material layer, to remove a portion of the photoresist material layer; etching the light-shielding material layer and removing a portion of the light-shielding material layer not covered with the photoresist material layer; and removing the photoresist material layer, to form a mask pattern.

For example, in the fabrication method of the mask according to at least one embodiment of the present disclosure, in each of the scanning regions, the mask pattern is formed outside the partially overlapping region.

For example, in the fabrication method of the mask according to at least one embodiment of the present disclosure, in each of the scanning region, a portion of the mask pattern is formed in the partially overlapping region.

For example, in the fabrication method of the mask according to at least one embodiment of the present disclosure, the device is a display panel, the display panel includes a plurality of pixel units, each of the pixel units includes a display region and a non-display region, the non-effective region is the non-display region, and the effective region is the display region.

For example, in the fabrication method of the mask according to at least one embodiment of the present disclosure, the device is a touch panel, the touch panel includes a touch function region and a non-touch function region, the non-effective region is the non-touch function region, and the effective region is the touch function region.

For example, in the fabrication method of the mask according to at least one embodiment of the present disclosure, under a condition that the mask is used for forming a structural layer in the display panel, a projection of the mask pattern on a surface where the display panel is located is located in the display region or partially located in the non-display region.

For example, in the fabrication method of the mask according to at least one embodiment of the present disclosure, under a condition that the mask is used for forming the touch panel, a projection of the mask pattern on a surface where the touch panel is located is located in the touch function region or partially located in the non-touch function region.

For example, in the fabrication method of the mask according to at least one embodiment of the present disclosure, the structural layer includes one or more of an active layer, a gate insulating layer, a gate electrode, an interlayer insulating layer, a source-drain electrode layer, a passivation layer, a gate line and a data line.

At least one embodiment of the present disclosure provides a mask fabricated by using the fabrication method according to any of the above-mentioned embodiments.

At least one embodiment of the present disclosure provides a display panel fabricated with the mask according to any of the above-mentioned embodiments.

At least one embodiment of the present disclosure provides a touch panel fabricated with the mask according to any of the above-mentioned embodiments.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," or the like are only used to indicate relative position relationship, and when the position of the object which is described is changed, the relative position relationship may be changed accordingly.

Figure 1:
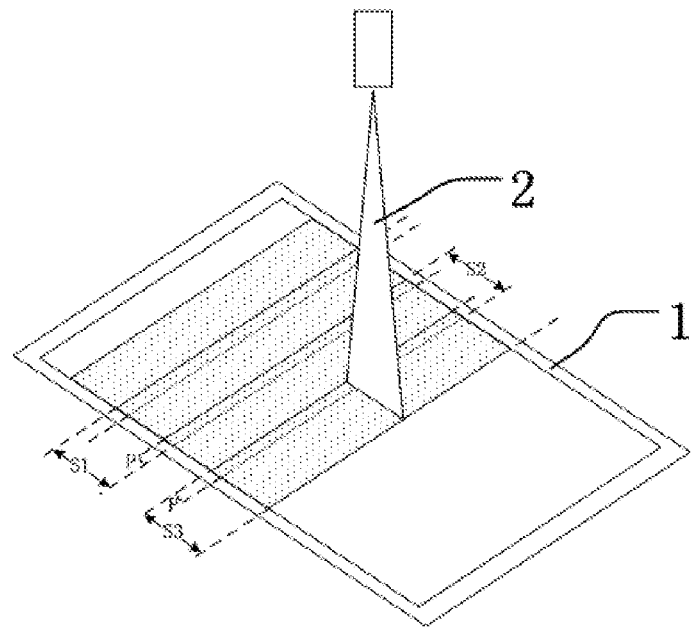
FIG. 1 is a schematic diagram of a fabrication method of a mask.

FIG. 1 is a schematic diagram of a fabrication method of a mask. For example, as shown in FIG. 1, during a fabricating process of the mask, after a material layer is deposited on a substrate 1, it is necessary to perform a patterning process (for example, coating photoresist, exposing, developing, etching, etc.) on it and to form a mask pattern on the substrate 1, and during exposing the photoresist, it is necessary to perform scanning exposure on the photoresist with a scanning beam 2; but since a width of the scanning beam 2 is limited, the mask needs to be divided into a plurality of scanning regions (e.g., S1, S2, S3, etc.) so as to complete exposure performed on the mask; however, in an actual process, in order to ensure that the exposure process is performed on the entire mask, adjacent scanning regions (e.g., S2 and S3) will partially overlap with each other, for example, partially overlapping regions between the scanning region S1 and the scanning region S2, between the scanning region S2 and the scanning region S3, are shown by regions P in FIG. 1.

Figure 2:
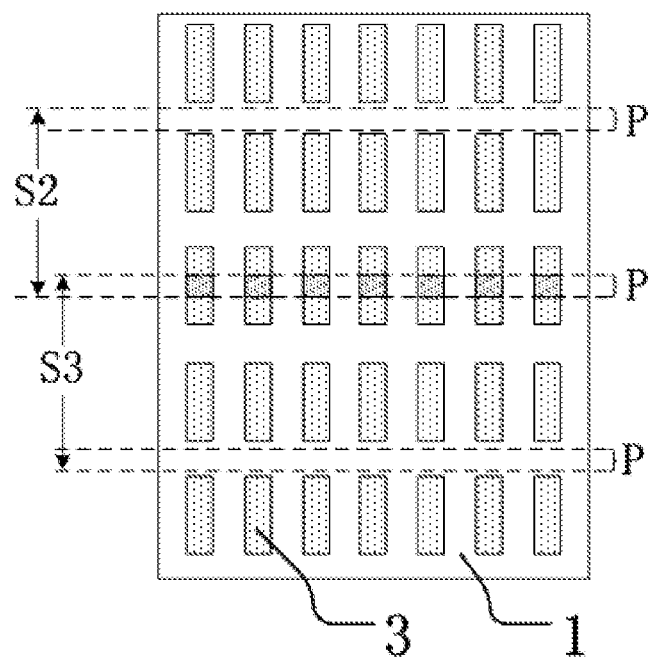
FIG. 2 is a structural schematic diagram of a mask obtained by using the fabrication method shown in FIG. 1.

FIG. 2 is a structural schematic diagram of the mask obtained by using the fabrication method shown in FIG. 1. As shown in FIG. 2, the mask comprises a plurality of mask patterns 3 thereon. In a photolithography process, a mask pattern is obtained by controlling energy of the scanning beam 2; however, a portion of photoresist in the region P may be repeatedly exposed by the scanning beam 2, so that a critical dimension (CD) of the mask pattern 3 formed in the region P is deviated. In addition, because multiple scanning exposures may be required in the fabrication procedure of the mask, the above-described CD deviation of the mask pattern 3 may be periodically presented. When the mask is used for fabricating a product, for example, a display panel, a periodical deviation of the mask pattern 3 in the mask may render a periodical defect to occur in a structure in the display panel, and the periodical deviation problem of the mask pattern 3 may be further enlarged in an exposure process performed on the structure of the display panel, for example, when a pattern of a display region of the display panel is formed with the mask pattern having a critical dimension deviation, a periodical defect may occur to, for example, a display image of the display panel. Moreover, as a resolution of the display panel increases, the problem of the display defect of the display panel caused by the above-described situation will also be more serious, which seriously restricts development of high resolution electronic display products, for example, display panels.

At least one embodiment of the present disclosure provides a fabrication method of a mask, comprising: providing a substrate; forming a photoresist material layer on the substrate; performing at least two times of scanning exposure on the photoresist material layer with a scanning beam, wherein, each time of scanning exposure is performed along a first direction parallel to a surface where the substrate is located, a scanning beam in each time of scanning exposure scans the photoresistive material layer in a scanning region having a preset width, at least one pair of adjacent scanning regions partially overlap with each other, and a partially overlapping region is located in a first region of the mask. For example, in at least one embodiment of the present disclosure, during a process for forming a structural layer of a device to be formed with a mask, a projection of the first region on a surface where the device is located coincides with a non-effective region of the device, and a preset width is a width of a scanning beam in a second direction perpendicular to the first direction.

It should be noted that, the first region ill the mask is an artificially-divided region, there may be no relevant structure (for example, mask pattern) in the mask to define a boundary of the region, and when the mask is used for fabricating a structural layer in the device, the first region corresponds to the non-effective region of the device. Therefore, in the following embodiments of the present disclosure, the mask when used for preparing the structural layer in the device is taken as a reference, and a position of the first region of the mask is indirectly defined by the non-effective region of the device.

There is a partially overlapping region extending in the first direction between scanning regions having a preset width in the second direction. During a fabrication process of the mask, an actual scanning width of the scanning beam may be set to be smaller than or equal to the preset width; when it is not necessary to form a mask pattern in the partially overlapping region, the actual scanning width of the scanning beam is smaller than the preset width; and when it is necessary to form a mask pattern in the partially overlapping region, the actual scanning width of the scanning beam is smaller than or equal to the preset width. Exemplarily, the scanning beam may include a plurality of scanning lines (e.g., laser lines, etc.), and during a procedure that the scanning beam scans along the first direction, energy distribution of the scanning beam (e.g., energy levels of laser lines at respective positions of the scanning beam) is controlled according to a mask pattern to be formed, so as to selectively expose a photoresist material; and therefore, during a procedure that the scanning beam performs scanning exposure on the photoresist material layer, the actual scanning widths of the scanning beam are set according to a shape of the mask pattern, and in a local region, the actual scanning width of the scanning beam is set to be smaller than the preset width.

Here, it should be noted that, a repeatedly exposed region refers to a region exposed by the scanning beam at least twice, actual scanning widths of scanning beams of adjacent scanning regions may be different or the same, and a partially overlapping region of two adjacent scanning regions having the preset width may be not scanned and exposed by any scanning beam, or may only be subject to actual scanning exposure of one of two scanning beams, or may be subject to actual scanning exposure of both scanning beams.

When the device is fabricated with the mask fabricated in this way, the partially overlapping region corresponds to the non-effective region in the device; when the mask pattern is provided in the partially overlapping region, a region of the photoresist material layer repeatedly exposed by the scanning beam is also located in the partially overlapping region, so that the region of the photoresist material layer repeatedly exposed by the scanning beam also corresponds to the non-effective region in the device, and in this way, even if there is a dimension deviation in the mask pattern in the repeatedly exposed region, since the pattern corresponds to the non-effective region of the device, for example, corresponds to a non-display region of a display panel, the dimension deviation will not affect a pattern of an effective region of the device, for example, a pattern of the display region of the display panel, which, thus, will not result in a functional defect of the device. Further, when no mask pattern is formed in the partially overlapping region (the partially overlapping region of the scanning region having the preset width), the photoresist material layer at the region may not be repeatedly exposed by the scanning beam, so the critical dimension of the formed mask pattern is not affected, a functional defect of the device also may be caused. Therefore, the fabrication method of the mask according to an embodiment of the present disclosure is capable of reducing or even eliminating the functional defect problem of the device fabricated with the mask due to the defect caused by repeated exposure performed on the photoresist material layer.

Hereinafter, a mask and a fabrication method thereof, a display panel and a touch panel according to at least one embodiment of the present disclosure will be described in conjunction with the accompanying drawings.

Figure 3:
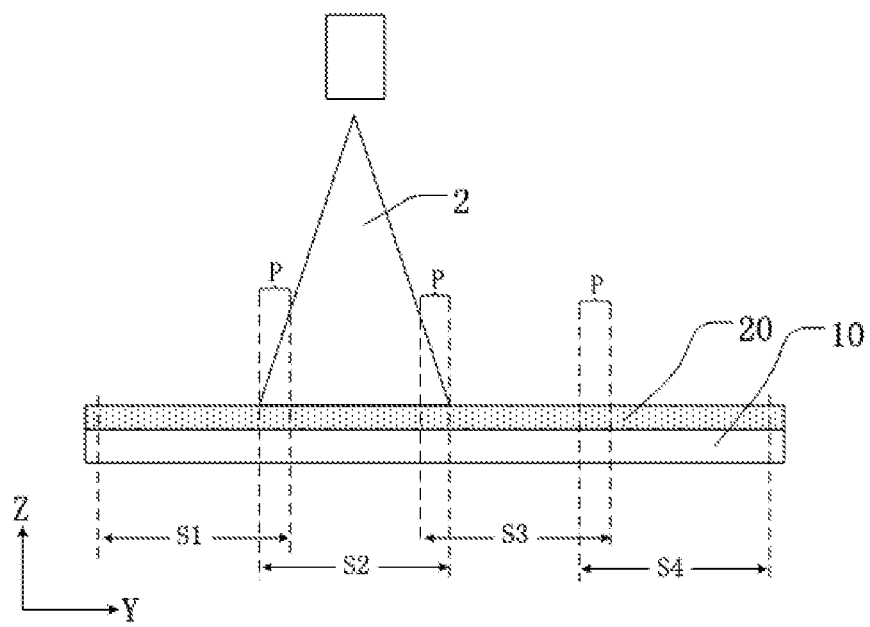
FIG. 3 is a schematic diagram of a fabrication method of a mask provided by an embodiment of the present disclosure.

At least one embodiment of the present disclosure provides a fabrication method of a mask, and FIG. 3 is a schematic diagram of a fabrication method of the mask provided by an embodiment of the present disclosure. For example, as shown in FIG. 3, the fabrication method of the mask comprises: providing a substrate 10; forming a photoresist material layer 20 on the substrate 10; performing at least two times of scanning exposure on the photoresist material layer 20 with a scanning beam 2, wherein, each time of scanning exposure is performed along a first direction X parallel to a surface where the substrate 10 is located, a scanning beam 2 in each time of scanning exposure scans the photoresist material layer 20 in a scanning region having a preset width, at least one pair of adjacent scanning regions partially overlap with each other, and a partially overlapping region P is located in a first region of the mask. The first region in the mask is not shown, and its position corresponds to a non-effective region in a device.

For example, in at least one embodiment of the present disclosure, during a procedure for forming a structural layer of the device with the mask, a projection of a first region on a surface where the device is located coincides with a non-effective region of the device, and a preset width is a width of a scanning beam 2 in a second direction Y perpendicular to a first direction.

In this embodiment, the partially overlapping region P corresponds to the non-effective region of the device, i.e., a scanning position of the scanning beam 2 and the preset width of scanning are defined according to a structural dimension of the device to be formed, so as to prevent a function of the device from being affected by a defect problem caused by repeated exposure in the mask. Hereinafter, structural relationship between the mask obtained by using the fabrication method according to the embodiment of the present disclosure and the device fabricated with the mask will be analyzed, to further explain the technical solution of the embodiment of the present disclosure.

In the embodiment of the present disclosure, positions, directions, etc., of respective structures are specified with the substrate 10 as a reference, in order to explain the technical solution of the embodiment of the present disclosure. For example, as shown in FIG. 3, a three-dimensional coordinate system is established with the substrate 10 as a reference, directions of an X-axis (not shown, for which FIG. 4 may be referred to) and an Y-axis are parallel to a surface where the substrate 10 is located, and a direction of a Z-axis is perpendicular to the surface where the substrate 10 is located. For example, in the embodiment of the present disclosure, the direction of the X-axis may be the first direction, and the direction of the Y-axis may be the second direction.

For example, as shown in FIG. 3, in a fabrication procedure of the mask, the photoresist material layer 20 has a plurality of scanning regions thereon, for example, a scanning region S1, a scanning region S2, a scanning region S3 and a scanning region S4, and each scanning region has a preset width and extends in the X-axis direction. There is a partially overlapping region P between adjacent scanning regions, for example, between S1 and S2, S2 and S3, S3 and S4. The photoresist material layer 20 located in the partially overlapping region P may be repeatedly exposed by the scanning beam 2. It should be noted that, energy distribution of the scanning beam 2 is set according to a structure of the mask that needs to be formed, so an actual scanning width of the scanning beam may be smaller than the preset width of the scanning region, and thus, the photoresist material layer 20 in the partially overlapping region P is not necessarily all repeatedly exposed by the scanning beam 2, or it may not be repeatedly exposed, or it may not be exposed, but once the photoresist material layer 20 in the partially overlapping region is repeatedly exposed, a portion repeatedly exposed by the scanning beam 2 is located in the partially overlapping region P.

Here, the scanning region having the preset width is a maximum scanning width of the scanning beam 2. In practice, the actual scanning width may be smaller than or equal to the preset width, which will not be limited in the embodiment of the present disclosure.

In the embodiment of the present disclosure, a type of the device fabricated by the mask obtained by using the fabrication method of the mask according to the above-described embodiment will not be limited. For example, the device may be a display panel, a touch panel, and the like. Hereinafter, the technical solution of the embodiment of the present disclosure will be explained with a case where the device is a display panel as an example.

In the embodiment of the present disclosure, the device includes various structures, and masks needed for fabricating the various structures in the device may be different. Hereinafter, the technical solution of the following embodiment of the present disclosure will be explained, with a case where the device is a display panel, and the mask is used for fabricating a pixel electrode in the display panel as an example.

Figure 4:
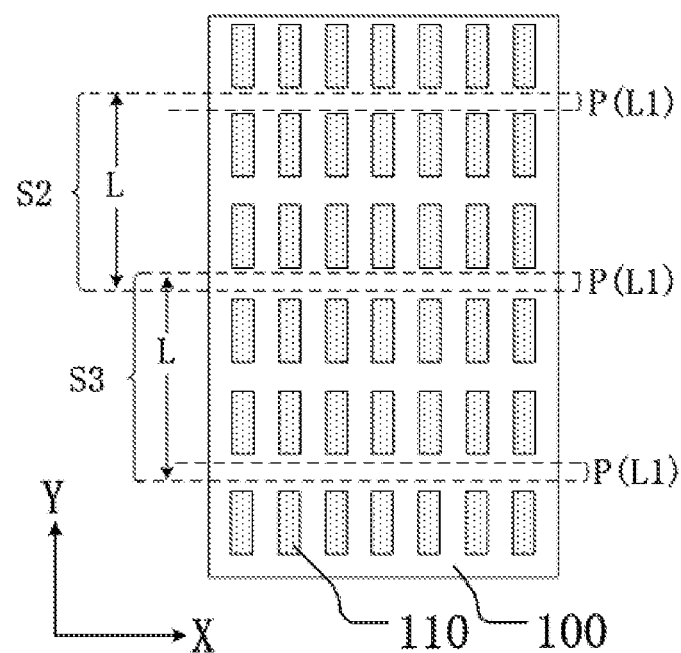
FIG. 4 is a structural schematic diagram of the mask obtained by using the fabrication method shown in FIG. 3.
Figure 5:
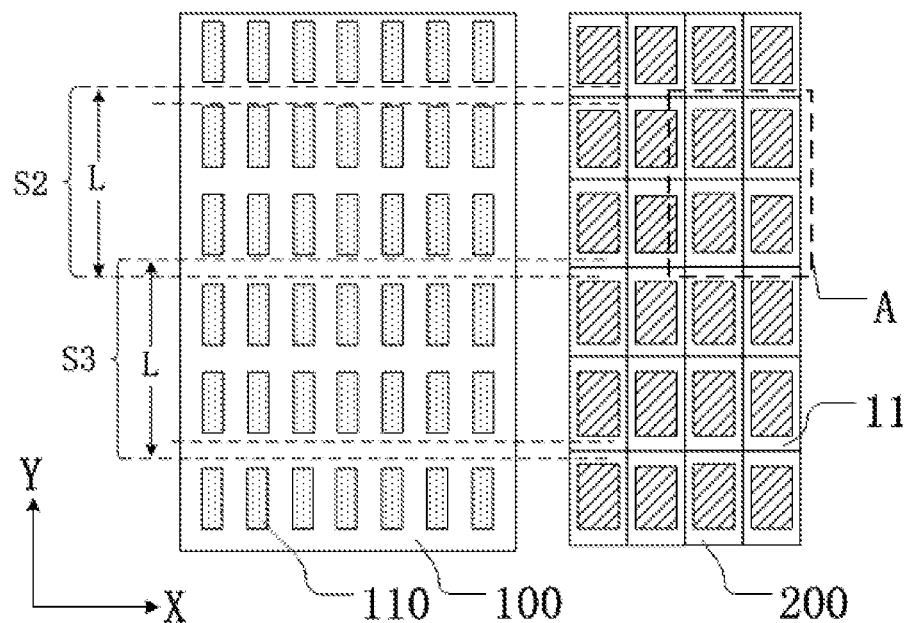
FIG. 5 is a schematic diagram of structural relationship between the mask shown in FIG. 4 and a device fabricated with the mask.

FIG. 4 is a structural schematic diagram of the mask obtained by using the fabrication method shown in FIG. 3; FIG. 5 is a schematic diagram of structural relationship between the mask shown in FIG. 4 and the device fabricated with the mask; and FIG. 6 is a structural schematic diagram of a region A shown in FIG. 5.

As shown in FIG. 4, a mask 100 obtained by using a fabrication method according to at least one embodiment of the present disclosure comprises a plurality of mask patterns 110. As shown in FIG. 3 and FIG. 4, a preset width of scanning regions S2 and S3 is L, and a width of a partially overlapping region P is L1. As shown in FIG. 5 and FIG. 6, a display panel 200 may include a plurality of pixel units 210, each pixel unit 210 includes a non-display region 211 and a display region 212, the non-display region 211 is, for example, located around the display region 212, a display region 212 of a display unit 210 is an effective region of the display panel 200, and a non-display region 211 of the display unit 210 is a non-effective region 11 of the display panel 200. In this embodiment, a first region in the mask corresponds to the non-effective region 11 (a non-display region 211) of the display panel 200. Exemplarily, when a structural layer of the display panel 200 is fabricated with the mask, a projection of a portion of the mask located in the first region on the display panel 200 coincides with the non-display region 211.

Figure 6:
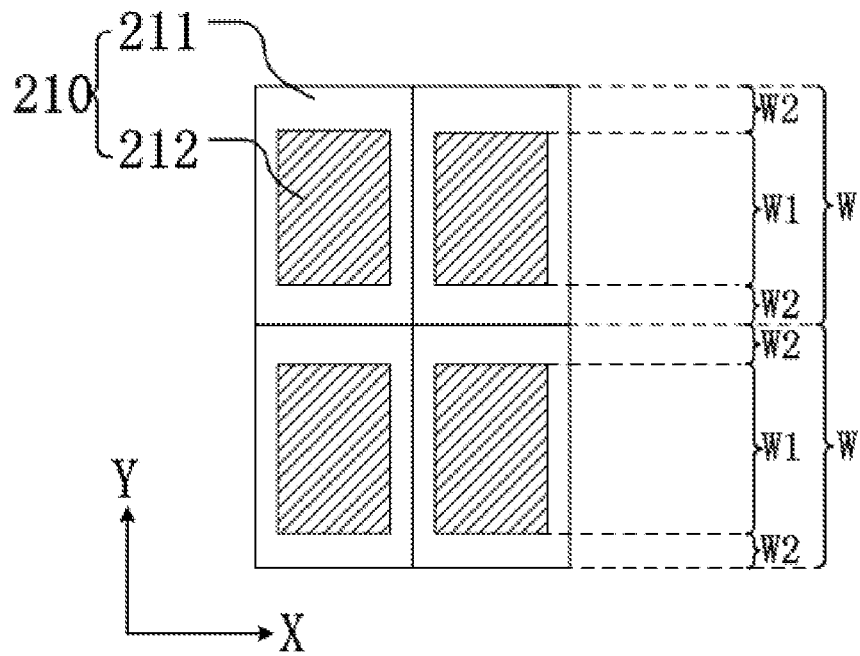
FIG. 6 is a structural schematic diagram of a region A shown in FIG. 5.

As shown in FIG. 4, FIG. 5 and FIG. 6, a mask pattern 110 on the mask 100 is used for fabricating a pixel electrode in the display panel 200; if a portion of the mask pattern 110 is located in the partially overlapping region P, the portion of the mask pattern 110 located in the region P will incur a defect because a photoresist material layer 20 is subject to repeated exposure performed by the scanning beam 2. However, a portion of the pixel electrode formed by using a pattern of the mask pattern 110 located in the region P is located in the non-effective region 11 (the non-display region 211) of the display panel 200, and during a display procedure of the display panel 200, a structural defective portion of the pixel electrode will not affect a display image in the display region 212, which improves a display effect of the display image of the display panel. Alternatively, there is no mask pattern, or no mask pattern repeatedly exposed in the partially overlapping region P, so that the portion of mask pattern does not have a critical dimension deviation and will not bring any adverse effect to the structural layer of the device to be formed.

Here, it should be noted that, the partially overlapping region corresponds to the non-effective region, or, a projection of the partially overlapping region on a surface where the device is located is located within the non-effective region of the device, which refers to that, when the structural layer in the device is formed with the mask, the partially overlapping region is used for forming a pattern in the non-effective region, for example, the partially overlapping region is located within the non-effective region after projection with an optical system of a stepping lithography machine.

In the embodiment of the present disclosure, a type of the scanning beam 2 will not be limited. For example, the scanning beam 2 may be a laser beam, an electron beam, and the like.

In the embodiment of the present disclosure, a dimension of the preset width and a position of the scanning region are set according to a specific structure of the device. Hereinafter, the dimension of the preset width and the position of the scanning region will be limited according to the specific structure of the device.

For example, in at least one embodiment of the present disclosure, as shown in FIG. 6, a device includes an effective region. For example, when a structural layer in the device (for example, a display panel 200) is formed with the mask, a miniature ratio of the mask is set to be X:1; in a second direction (a direction of a Y-axis), the effective region (for example, a display region 212 in a pixel unit 210 of the display panel) has a width of W1, a non-effective region has a width of W2, each effective region has its both sides respectively provided with non-effective regions with a preset width of L, and the preset width satisfies:

$$X^*(W1+W2) \le L \le X^*(N^*(W1+W2)+2^*W2)$$

Where, N is a positive integer, and X>0.

In a procedure of fabricating the device with the mask, a specific value of the miniature ratio of the mask may be set according to an actual process. Exemplarily, for example, the miniature ratio of the mask may be 4:1, and a dimension of a mask pattern on the mask is four times the dimension of the structure fabricated by using the mask pattern; for example, the miniature ratio of the mask may be 1:1, and the dimension of the mask pattern on the mask may be equal to the dimension of the structure fabricated by using the mask pattern. For example, in a case where the miniature ratio of the mask is 1:1, when the structural layer in the device is formed with the mask, a projection of the mask on a surface where the device is located may be an orthogonal projection, that is, an orthogonal projection of a first region of the mask on the surface where the device is located coincides with the non-effective region of the device.

For example, in at least one embodiment of the present disclosure, as shown in FIG. 4, FIG. 5 and FIG. 6, a width of a partially overlapping region P is L1, the width of the partially overlapping region P satisfies: $0 \leq L1 \leq 2X^*W2$, and the width of the partially overlapping region P is a width in a second direction (the direction of the Y-axis).

In the embodiment of the present disclosure, a limitation mode of positions of the non-display region 211 and the display region 212 in the display panel 200 will not be limited. Exemplarily, the display panel 200 may further include a black matrix provided on, for example, a display side thereof, an opening of the black matrix may correspond to the display region 212 of the display panel 200, and a light-shielding portion of the black matrix corresponds to the non-display region 211 (the non-effective region) of the display panel 200.

For example, in an actual process, as limited by precision, etc., of an exposure device, the width of the partially overlapping region P may be 8 μm to 20 μm; while with respect to a current device, for example, a display panel, having pixels per inch (PPI) of 400 or more, a width of a non-effective region between adjacent pixel units is also usually more than 20 microns. Therefore, in an embodiment of the present disclosure, with a case where the miniature ratio of the mask is 1:1 as an example, with respect to a structure (for example, a pixel electrode) located in, for example, the display region, in the display panel, a mask pattern in the mask used for forming the pixel electrode may completely avoid the partially overlapping region P, so that a critical dimension of the pixel electrode formed with the mask is not affected; in addition, it is also not necessary to improve precision of the exposure device, so costs are reduced.

For example, in at least one embodiment of the present disclosure, the device may further be a touch panel. For example, the touch panel may include a touch function region and a non-touch function region; a non-effective region in the device is a non-touch function region, and an effective region in the device is a touch function region. For example, when the mask is used for forming a structural layer in the touch panel, a first region of the mask corresponds to the non-touch function region of the touch panel.

Figure 7A:
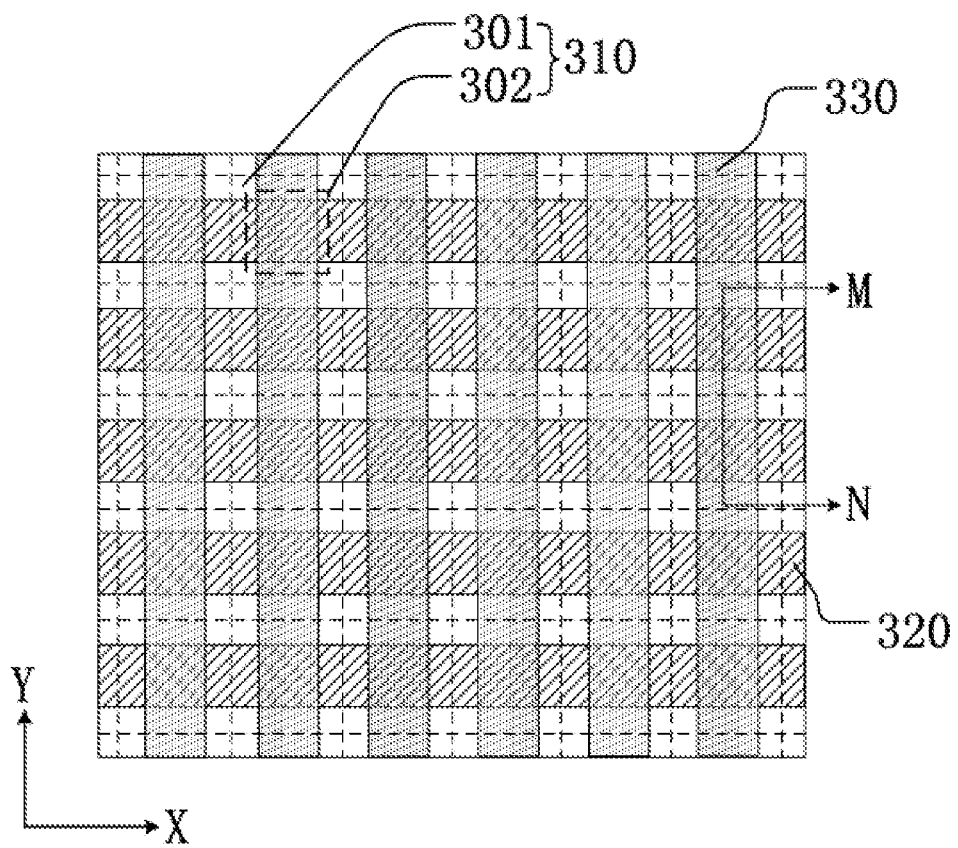
FIG. 7A is a plan view of a touch panel provided by an embodiment of the present disclosure.
Figure 7B:
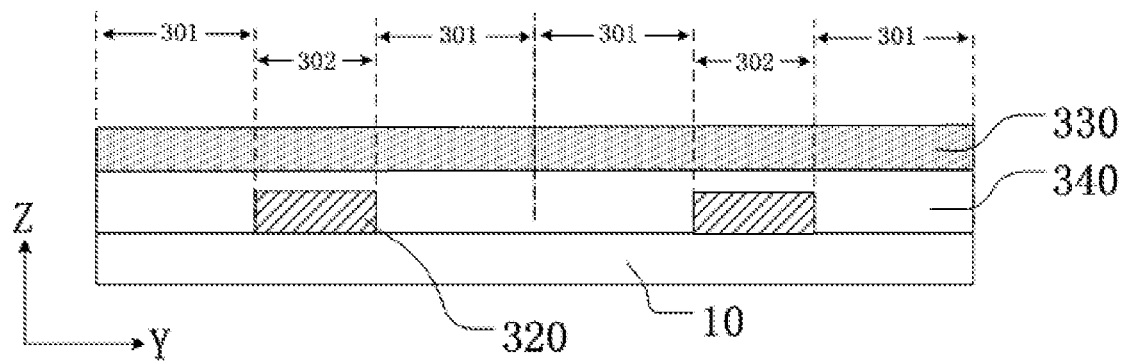
FIG. 7B is a sectional view of the touch panel shown in FIG. 7A along M-N.

FIG. 7A is a plan view of a touch panel provided by an embodiment of the present disclosure; and FIG. 7B is a sectional view of the touch panel shown in FIG. 7A along M-N. For example, in at least one embodiment of the present disclosure, as shown in FIG. 7A and FIG. 7B, the touch panel 300 includes a plurality of touch units 310, and each touch unit 310 may include at least one touch function region 302 and a non-touch function region 301 surrounding the touch function region 302. The touch panel 300 includes, for example, a plurality of first electrodes 320 and a plurality of second electrodes 330 provided on a substrate 10. The first electrode 320 extends in an X-axis direction, and the second electrode 330 extends in a Y-axis direction. In a Z-axis direction, an insulating layer 340 is provided between the first electrode 320 and the second electrode 330; in this way, a region where the first electrode 320 and the second electrode 330 overlap with each other may form a capacitor; when a foreign object approaches, a capacitance of a capacitor in a corresponding region changes, and a touch point may be located by detecting a position of the capacitor whose capacitance changes. In this embodiment, a first region in the mask corresponds to a non-effective region (the non-touch function region 301) of the touch panel 300. Exemplarily, when a structural layer of the touch panel 300 is fabricated with the mask, a projection of a portion of the mask located in the first region on the touch panel 300 coincides with the non-touch function region 301.

For example, as shown in FIG. 7A and FIG. 7B, a region where the first electrode 320 and the second electrode 330 overlap with each other corresponds to the touch function region 302 of the touch panel 300, and other regions of the touch panel 300 are the non-touch function region 301. A projection of the partially overlapping region P (e.g., a region where a scanning region S2 and a scanning region S3 overlap with each other) on the touch panel 300 is located in the non-touch function region 301 of the touch panel 300.

Figure 7C:
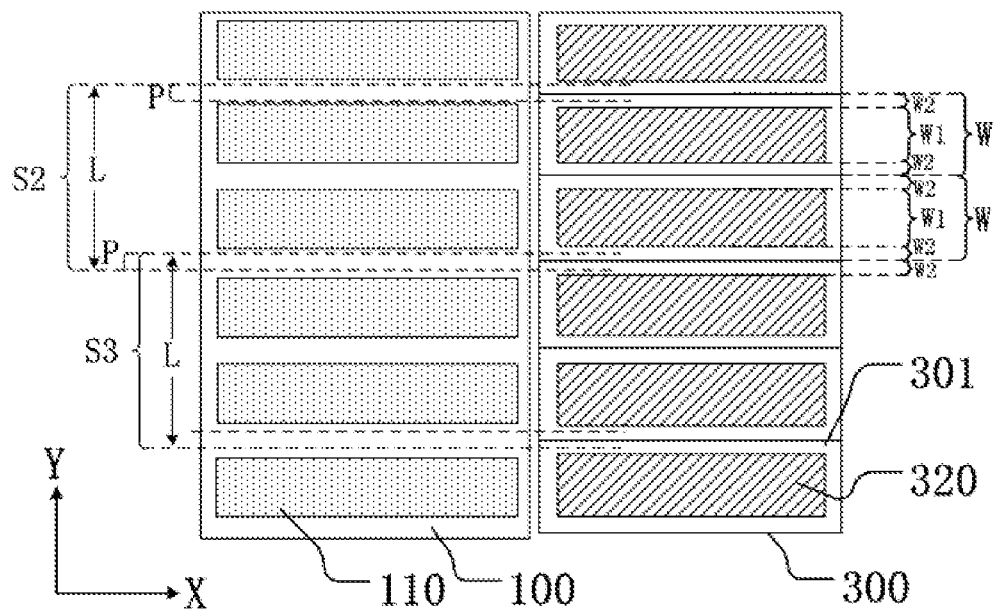
FIG. 7C is a schematic diagram of structural relationship between a mask provided by an embodiment of the present disclosure and a device fabricated with the mask.

FIG. 7C is a schematic diagram of structural relationship between the mask provided by the embodiment of the present disclosure and the device fabricated with the mask; and the mask, for example, is used for fabricating the first electrode 320 in the touch panel 300. For example, as shown in FIG. 7A, FIG. 7B and FIG. 7C, the projection of the partially overlapping region P on the touch panel 300 is at least partially located in the non-touch function region 301, and is further, for example, completely located in the non-touch function region 301. For example, the mask pattern 110 is located outside the region P (an overlapping region with the preset width of the scanning beam 2), which will neither affect a critical dimension of the formed first electrode 320, nor affect a touch function of the touch function region 302 of the touch panel 300. For example, the mask pattern 110 is partially located in the region P (a region where a portion of the photoresist material layer repeatedly exposed by the scanning beam is located), a portion of the first electrode 320 formed by using the pattern of the mask pattern 110 located in the region P is located in the non-touch function region; during a use procedure of the touch panel 300, a structural defective portion in the first electrode 320 will not affect the touch function in the touch function region 302, which improves a touch effect of the touch panel 300.

When the mask is used for fabricating the touch panel 300, for a parameter of the scanning beam 2 for fabricating the mask (for example, the preset width and the position of the scanning region), related contents in the foregoing embodiments (the embodiments in which the device fabricated with the mask is the display panel) may be referred to, which will not be repeated in the embodiment of the present disclosure. A specific position of the mask pattern on the mask will not be limited in the embodiment of the present disclosure, which may be arranged according to actual needs. For example, in at least one embodiment of the present disclosure, in each scanning region, a mask pattern may be formed outside a partially overlapping region (an overlapping region with a preset width of the scanning beam 2), and the scanning beam 2 may not perform repeated scanning exposure on a photoresist material layer of the partially overlapping region, so that there is no defect in the mask pattern due to repeated exposure performed on the photoresist material layer. For example, in at least one embodiment of the present disclosure, in each scanning region, a portion of a mask pattern may be formed in a partially overlapping region (a region where a portion of a photoresist material layer repeatedly exposed by the scanning beam is located), so that the portion of the mask pattern located in the partially overlapping region may have a critical dimension deviation, due to repeated exposure performed on the photoresist material layer; however, the mask pattern in the partially overlapping region corresponds to a non-effective region of a device, that is, the mask pattern of the partially overlapping region is used for forming a pattern of the non-effective region of the device; and therefore, the defect of the mask pattern caused by repeated exposure will not affect an effective region of the device, which ensures a performance of the device.

For example, in at least one embodiment of the present disclosure, when a mask is used for forming a structural layer in a display panel, a projection of a mask pattern on a surface where the display panel is located is at least partially located in a non-display region in a pixel unit. For example, the projection of the mask pattern on the surface where the display panel is located is completely located within the display region; for example, a portion of a project of the mask pattern on the surface where the display panel is located is located in the non-display region. Positional relationship between the mask pattern and the structure fabricated with the same is determined according to a type of the structure, and as long as a projection of a partially overlapping region of the mask on the display panel is located in the non-display region, a display defect of the display panel may be reduced or eliminated.

For example, in at least one embodiment of the present disclosure, a mask pattern 110 may be used for forming a structural layer in a display panel 200, the structural layer may include one or more of an active layer, a gate insulating layer, a gate electrode, an interlayer insulating layer, a source-drain electrode layer, a passivation layer, a gate line and a data line. A distribution position of the mask pattern 110 on a mask is determined according to a position of the structural layer of the display panel 200 fabricated with the mask in the display panel 200.

Exemplarily, when the mask is used for fabricating a pixel electrode in the display panel 200, in a procedure for fabricating the display panel 200 with the mask, a projection of the mask pattern 110 on a surface where the display panel is located may be set to at least cover a display region 212 in a pixel unit 210, and may also partially extend into a non-display region 211 in the pixel unit 210. For example, the mask pattern 110 is formed outside a partially overlapping region P of the mask (an overlapping region with a preset width of a scanning beam 2), the scanning beam 2 may not perform repeated scanning exposure on a photoresist material layer of the overlapping region, and a critical dimension of the pixel electrode is not affected. For example, in each scanning region, a portion of the mask pattern 110 is formed in the partially overlapping region P (a region where a portion of the photoresist material layer repeatedly exposed by the scanning beam is located); a portion of the pixel electrode corresponding to the partially overlapping region P, that is, the portion of the pixel electrode formed by using the mask pattern in the partially overlapping region P, is located in the non-display region 211 in the pixel unit 210, which will not affect a display image of the pixel unit 210.

Exemplarily, when the mask is used for fabricating the gate line in the display panel 200, in a procedure of fabricating the display panel 200 with the mask, the projection of the mask pattern 110 on the surface where the display panel is located is located in the non-display region 211 in the pixel unit 210. For example, a major portion of the mask pattern 110 is formed outside the partially overlapping region P of the mask, and thus, even if a portion of the gate line fabricated by using the mask corresponding to the partially overlapping region P may have an electrical defect problem, since the partially overlapping region corresponds to the non-display region, a remaining portion of the gate line has a good electrical function, and the defect occurring to the gate line located in the non-display region will not cause a problem such as a display defect in the display region of the display panel 200. For example, the mask pattern 110 may be entirely formed outside the partially overlapping region P of the mask (the overlapping region with the preset width of the scanning beam 2), and the scanning beam 2 may not perform repeated scanning exposure on the photoresist material layer of the overlapping region, in which case a critical dimension of the gate line is not affected, and an electrical performance of the gate line fabricated with the mask may be further improved.

For example, in at least one embodiment of the present disclosure, when a mask is used for forming a structural layer in a touch panel, a projection of a mask pattern on a surface where the touch panel is located is at least partially located in a non-touch function region of the touch panel. For example, the projection of the mask pattern on the surface where the touch panel is located is completely located within the touch function region; and for example, a portion of a projection of the mask pattern on the surface where the touch panel is located is located in the non-touch function region. Positional relationship between the mask pattern and the structure fabricated with the same is determined according to a type of the structure, and as long as a projection of a partially overlapping region of the mask on the touch panel is located in the non-touch function region, a touch function defect problem of the touch panel may be reduced or eliminated.

For example, in at least one embodiment of the present disclosure, a structural layer in a touch panel fabricated with a mask pattern 110 may be a touch electrode, and the touch electrode, for example, includes one or more of structures such as a driving electrode and a sensing electrode.

In the embodiment of the present disclosure, a formation mode, a specific structure and a type of the mask pattern in the mask will not be limited, which may be designed according to actual needs.

For example, in at least one embodiment of the present disclosure, a fabrication method of a mask further comprises: directly developing a photoresist material layer to obtain a mask pattern, after exposing the photoresist material layer.

For example, in at least one embodiment of the present disclosure, a fabrication method of a mask comprises: forming a light-shielding material layer on a substrate; and the fabrication method further comprises: developing a photoresist material layer, to remove a portion of the photoresist material layer; etching the light-shielding material layer and removing a portion of the light-shielding material layer not covered with the photoresist material layer; and removing the photoresist material layer, to form a mask pattern. Hereinafter, different fabrication methods of the above-described mask will be explained respectively.

Figure 8:
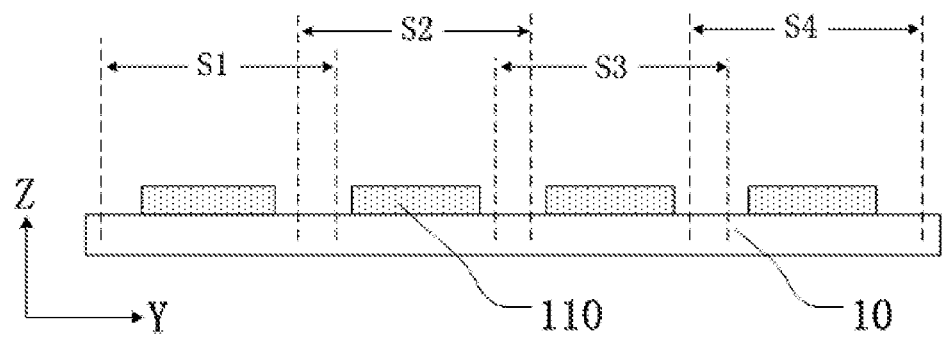
FIG. 8 is a procedure chart of a fabrication method of a mask provided by an embodiment of the present disclosure.

For example, in at least one embodiment of the present disclosure, FIG. 8 is a procedure chart of a fabrication method of a mask provided by an embodiment of the present disclosure. For example, as shown in FIG. 8, the fabrication method of the mask may further comprise: developing a photoresist material layer 20 to selectively remove a portion of the photoresist material layer 20 and obtain a mask pattern 110, after a scanning beam 2 as shown in FIG. 3 performs scanning exposure on the photoresist material layer 20. The photoresist material layer 20 may be made of photoresist doped with a light-shielding material, and the like. For example, in some embodiments of the present disclosure, as shown in FIG. 8, after development, a remaining portion of a photoresist material layer 20 forms a mask pattern 110; for example, in other embodiments of the present disclosure, after development, a removed portion of a photoresist material layer 20 forms a mask pattern 110.

Figure 9A:
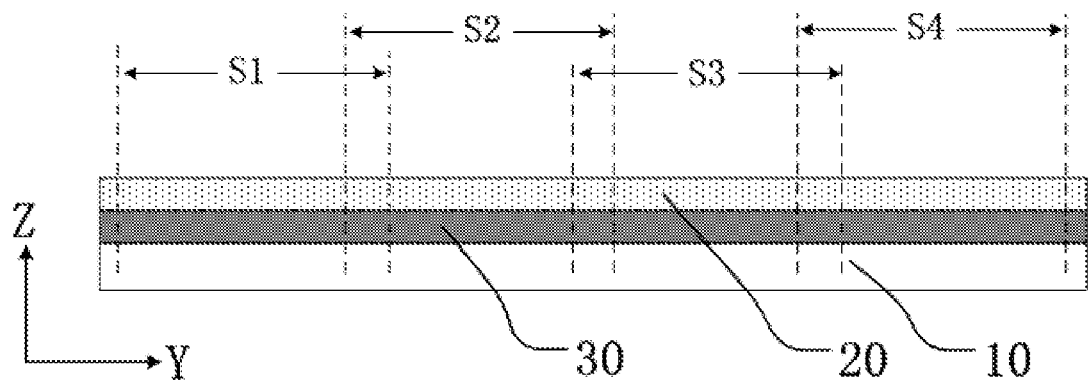
FIG. 9A to FIG. 9D are procedure charts of another fabrication method of a mask provided by an embodiment of the present disclosure.
Figure 9B:
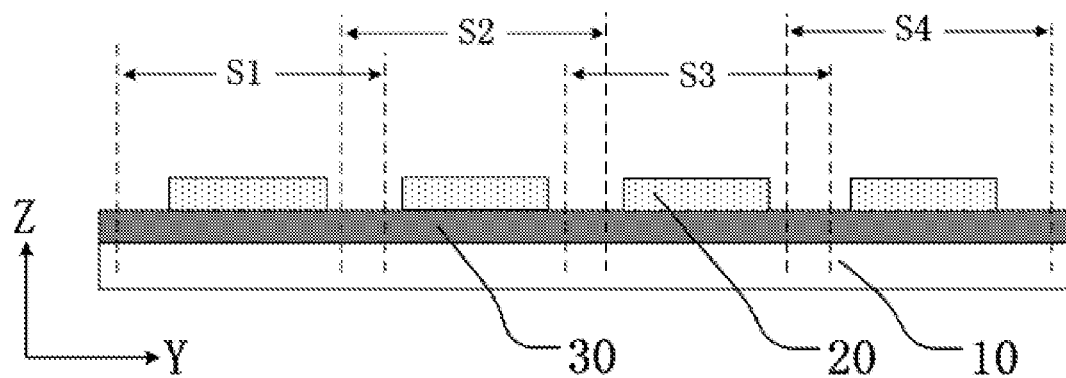
Figure 9C:
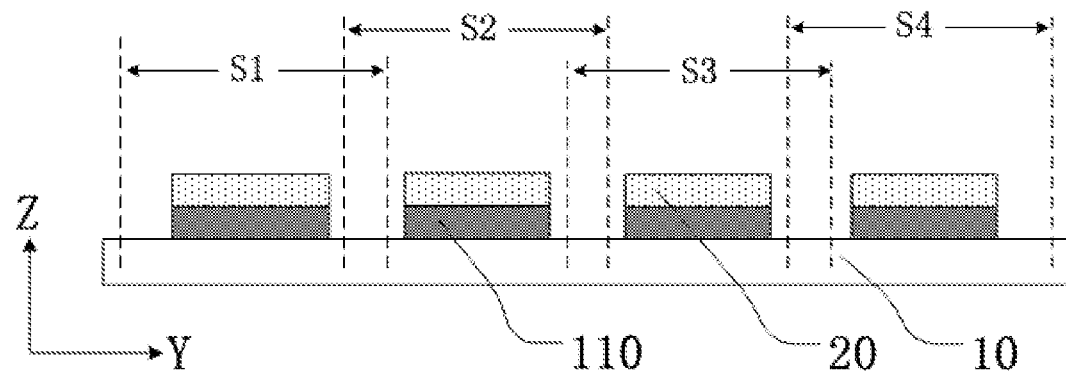
Figure 9D:
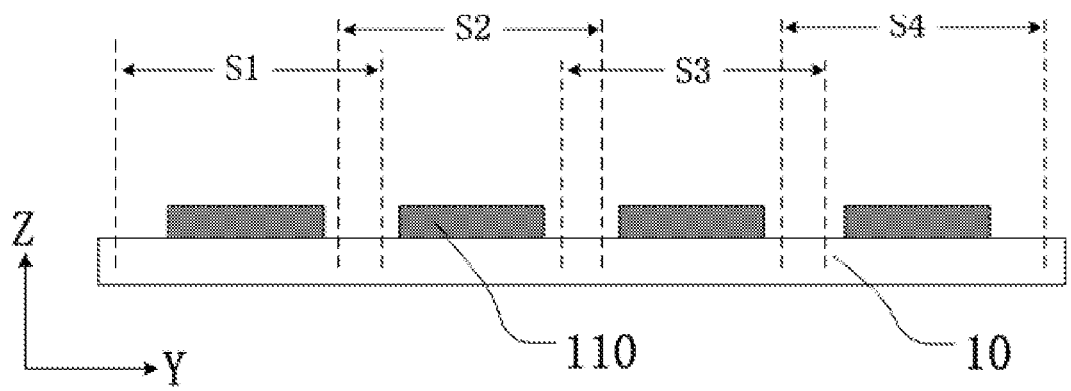

For example, in at least one embodiment of the present disclosure, FIG. 9A to FIG. 9D are procedure charts of another fabrication method of a mask provided by an embodiment of the present disclosure. As shown in FIG. 9A, before the forming a photoresist material layer 20 on the substrate 10, the fabrication method of the mask further comprises: forming a light-shielding material layer 30 on the substrate 10; developing the photoresist material layer to remove a portion of the photoresist material layer, after a scanning beam 2 performs scanning exposure on the photoresist material layer 20, as shown in FIG. 9B; etching a portion of the light-shielding material layer 30 not covered with the photoresist material layer 20, as shown in FIG. 9C; and removing the remaining photoresist material layer 20 to form a mask pattern 110, as shown in FIG. 9D. For example, in some embodiments of the present disclosure, as shown in FIG. 9D, a remaining portion of a light-shielding material layer 30 forms a mask pattern 110; for example, in other embodiments of the present disclosure, after development, a removed portion of a light-shielding material layer 30 forms a mask pattern 110.

In the embodiment of the present disclosure, the material for preparing the light-shielding material layer 30 will not be limited. For example, the light-shielding material layer 30 may be made of a material such as a black resin, a metal, and a metal alloy.

At least one embodiment of the present disclosure provides a mask, fabricated by using the fabrication method according to any one of the foregoing embodiments. For a specific structure of the mask, related contents in the foregoing embodiments (the embodiments on the fabrication method of the mask) may be referred to, which will not be repeated in the embodiment of the present disclosure. For example, the mask may be a monotone mask, and may also be a gray-tone mask.

At least one embodiment of the present disclosure provides a display panel, which may be fabricated with the mask according to any one of the foregoing embodiments.

For example, in at least one embodiment of the present disclosure, the display panel may be a liquid crystal display panel, comprising an array substrate and an opposite substrate, which are arranged opposite to each other so as to form a liquid crystal cell, in which a liquid crystal material is filled. The opposite substrate is, for example, a color filter substrate. A pixel electrode of each pixel unit of the array substrate is used for applying an electric field to control a rotation degree of the liquid crystal material, so as to perform a display operation.

For example, in at least one embodiment of the present disclosure, the display panel may be an organic light-emitting diode (OLED) display panel, wherein, a laminate of organic light-emitting materials is formed on an array substrate of the display panel, and a pixel electrode of each pixel unit is used as an anode or a cathode, for driving the organic light-emitting material to emit light, so as to perform a display operation.

For example, in at least one embodiment of the present disclosure, the display panel may be an electronic paper display panel, wherein, an electronic ink layer is formed on an array substrate of the display panel, and a pixel electrode of each pixel unit is used for applying a voltage for driving charged microparticles in electronic ink to move, so as to perform a display operation.

At least one embodiment of the present disclosure provides a touch panel, which may be fabricated with the mask according to any one of the foregoing embodiments. A type of the touch panel will not be limited in the embodiment of the present disclosure. For example, the touch panel may be a resistive touch panel, a capacitive touch panel, or an optical touch panel.

For example, in at least one embodiment of the present disclosure, the touch panel may comprise a plurality of driving electrodes arranged in parallel and a plurality of sensing electrodes arranged in parallel, the driving electrode and the sensing electrode intersect with each other, a capacitor is formed at a position where the driving electrode and the sensing electrode intersect with each other, the capacitance of the capacitor is interfered by a foreign object, and a touch point may be located by detecting the capacitance of the capacitor, so as to implement a touch sensing function.

The embodiments of the present disclosure provide the mask and the fabrication method thereof, the display panel and the touch panel, and may have at least one of advantageous effects below:

(1) In the fabrication method of the mask provided by at least one embodiment of the present disclosure, the partially overlapping region between adjacent scanning regions having the preset width of the photoresist material layer is located within the first region of the mask, the first region corresponds to the non-effective region in the device, which, thus, reduces or eliminates the defect problem of the device fabricated with the mask due to the defect caused by repeated exposure performed by the scanning beam on the photoresist material layer.

(2) In the fabrication method of the mask provided by at least one embodiment of the present disclosure, the formed mask pattern may be located outside the partially overlapping region between adjacent scanning regions having the preset width, which reduces or eliminates the defect in the mask pattern, and further improves quality of the device fabricated with the mask.

(3) In the fabrication method of the mask provided by at least one embodiment of the present disclosure, the formed mask pattern may be partially located in a partially overlapping region between adjacent scanning regions having the preset width; however, because the partially overlapping region corresponds to the non-effective region of the device to be formed, it will not affect the pattern of the effective region, which, thus, reduces or eliminates the defect problem of the device fabricated with the mask due to the defect caused by repeated exposure performed by the scanning beam on the photoresist material layer.

The following statements should be noted:

(1) The accompanying drawings involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, the thickness of a layer or a region may be enlarged or decreased, that is, the accompanying drawings are not drawn according to the actual scale.

(3) In case of no conflict, features in one embodiment or in different embodiments can be combined.

What are described above is related to the specific embodiments of the disclosure only and not limitative to the scope of the disclosure. The protection scope of the disclosure shall be based on the protection scope of the claims.

The application claims priority to the Chinese patent application No. 201710975409.9, filed Oct. 16, 2017, the disclosure of which is incorporated herein by reference as part of the application.

The invention claimed is:

1. A method of fabricating a structural layer of a device by using a mask,
   wherein the device comprises an effective region and a non-effective region, and during using the mask to form the structural layer of the device, a projection of a first region of the mask on a surface where the device is located coincides with the non-effective region of the device,
   a miniature ratio of the mask is X:1, and in a second direction parallel to the surface where the device is located, the effective region has a width of W1, the non-effective region has a width of W2, the non-effective regions are provided at both sides of each of the effective regions, the mask comprises a preset width L, and the preset width L satisfies:

$X*(W1+W2) \leq L \leq X*(N*(W1+W2)+2*W2)$, wherein
   N is a positive integer, and X>0, wherein the mask is fabricated by a following method:
   providing a substrate;
   forming a light-shielding material layer on the substrate;
   forming a photoresist material layer on the light-shielding material layer;
   performing at least two scanning exposure processes on the photoresist material layer by using a scanning beam;
   developing the photoresist material layer, to remove a portion of the photoresist material layer;
   etching the light-shielding material layer and removing a portion of the light-shielding material layer not covered with the photoresist material layer; and
   removing the photoresist material layer, to form a mask pattern,
   wherein each of the at least two scanning exposure processes is performed along a first direction parallel to a surface where the substrate is located, the first direction is perpendicular to the second direction, the scanning beam in each of the at least two scanning exposure processes scans the photoresist material layer in a scanning region having the preset width, the preset width is a maximum scanning width of the scanning beam in a second direction perpendicular to the first direction, at least one pair of adjacent scanning regions partially overlap with each other, and a partially overlapping region of the at least one pair of adjacent scanning regions is located in the first region of the mask, and in each of the scanning regions, the mask pattern is formed outside the partially overlapping region.

2. The method according to claim 1, wherein a width of the partially overlapping region is L1, the width of the partially overlapping region satisfies: $0 \leq L1 \leq 2X*W2$, and the width of the partially overlapping region is a width in the second direction.

3. The method according to claim 1, wherein the device is a display panel, the display panel includes a plurality of pixel units, each of the pixel units includes a display region and a non-display region, the non-effective region is the non-display region, and the effective region is the display region.

4. The method according to claim 3, wherein under a condition that the mask is used for forming a structural layer in the display panel, a projection of the mask pattern on a surface where the display panel is located in the display region or partially located in the non-display region.

5. The method according to claim 4, wherein the structural layer includes one or more of an active layer, a gate insulating layer, a gate electrode, an interlayer insulating layer, a source-drain electrode layer, a passivation layer, a gate line and a data line.

6. The method according to claim 1, wherein the device is a touch panel, the touch panel includes a touch function region and a non-touch function region, the non-effective region is the non-touch function region, and the effective region is the touch function region.

7. The method according to claim 6, wherein under a condition that the mask is used for forming the touch panel, a projection of the mask pattern on a surface where the touch panel is located is located in the touch function region or partially located in the non-touch function region.

8. A touch panel, fabricated with the method according to claim 1.

* * * * *